United States Patent
Park et al.

(10) Patent No.: US 7,535,319 B2
(45) Date of Patent: May 19, 2009

(54) BAND PASS FILTER AND DUPLEXER HAVING THE SAME

(75) Inventors: Yun-kwon Park, Dongducheon-si (KR); In-sang Song, Seoul (KR); Seok-chul Yun, Yongin-si (KR); Kuang-woo Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 119 days.

(21) Appl. No.: 11/637,768

(22) Filed: Dec. 13, 2006

(65) Prior Publication Data

US 2007/0182508 A1 Aug. 9, 2007

(30) Foreign Application Priority Data

Feb. 6, 2006 (KR) .................... 10-2006-0011032

(51) Int. Cl.
*H03H 9/70* (2006.01)
*H03H 9/54* (2006.01)

(52) U.S. Cl. ........................ 333/133; 333/189
(58) Field of Classification Search ................ 333/189, 333/193, 133
See application file for complete search history.

(56) References Cited

U.S. PATENT DOCUMENTS

| | | | | |
|---|---|---|---|---|
| 5,499,003 A * | 3/1996 | Davenport | .................. | 333/195 |
| 6,262,637 B1 * | 7/2001 | Bradley et al. | .............. | 333/133 |
| 6,600,390 B2 * | 7/2003 | Frank | .......................... | 333/189 |
| 6,870,446 B2 * | 3/2005 | Ohara et al. | ................. | 333/188 |
| 6,909,338 B2 * | 6/2005 | Omote | ........................ | 333/133 |
| 6,927,649 B2 * | 8/2005 | Metzger et al. | ............. | 333/133 |
| 6,940,368 B2 * | 9/2005 | Plessky et al. | .............. | 333/193 |
| 6,972,641 B2 * | 12/2005 | Huynh | ........................ | 333/133 |
| 7,277,403 B2 * | 10/2007 | Frank | ......................... | 370/282 |
| 2005/0110596 A1 * | 5/2005 | Yamakawa et al. | .......... | 333/189 |

FOREIGN PATENT DOCUMENTS

| | | | |
|---|---|---|---|
| CN | 1619958 A | | 5/2005 |
| CN | 1638273 A | | 7/2005 |
| JP | 2000-022493 | * | 1/2000 |

OTHER PUBLICATIONS

C.W. Seabury et al.; Thin Film ZnO Based Bulk Acoustic Mode Filters; IEEE Microwave Symposium Digest, IEEE MTT-S International; vol. 1, pp. 181-184, Jun. 8-13, 1997.*

* cited by examiner

*Primary Examiner*—Barbara Summons
(74) *Attorney, Agent, or Firm*—Sughrue Mion, PLLC (57) ABSTRACT

A band pass filter for improving filtering, realizing high integration, and reducing manufacturing costs, and a duplexer having the band pass filter. The band pass filter comprises a first resonant circuit in which n first resonators are connected in series, where n is a natural number greater than 1; a second resonator circuit which faces the first resonant circuit and has m second resonators connected in series, where m is a natural number greater than 1; and a third resonant circuit in which k third resonators are connected in parallel on branching lines linking the first and second resonant circuits, where k is a natural number greater than 1. By arranging the resonators of the respective resonant circuits in the bridge structure, the filtering characteristics can be improved, the number of inductors used to adjust the resonant frequency characteristics of the resonators can be reduced, high integration can be realized and manufacture cost can be reduced.

17 Claims, 8 Drawing Sheets

FIG. 6 m1  
freq=2.074GHz  
dB(S(6,5))=-2.781 m2  
freq=2.135GHz  
dB(S(6,5))=-1.448 m4  
freq=1.947GHz  
dB(S(6,5))=-58.604 m5  
freq=1.882GHz  
dB(S(6,5))=-55.548

BAND PASS FILTER AND DUPLEXER HAVING THE SAME

CROSS-REFERENCE TO RELATED APPLICATIONS

This application claims priority under 35 U.S.C. § 119 from Korean Patent Application No. 10-2006-011032, filed on Feb. 6, 2006, in the Korean Intellectual Property Office, the disclosure of which is incorporated herein by reference in its entirety.

BACKGROUND OF THE INVENTION

1. Field of the Invention

The present invention generally relates to a band pass filter and a duplexer having the same. More particularly, the present invention relates to a band pass filter and a duplexer capable of improving filtering, and simultaneously achieving a high degree of integration and a reduction of manufacturing costs, by improving signal attenuation.

2. Description of the Related Art

Recently, as mobile communication devices such as mobile phones have become more widely used, there have been ongoing efforts to improve the performance of the mobile communication devices and to manufacture devices that are smaller and more lightweight. Accordingly, research into ways of achieving miniaturization and weight reduction is in progress through enhancement of the performance of components in the mobile communication device.

One of the essential components of a mobile communication device is a duplexer. A duplexer is a device that incorporates a filter. The duplexer permits efficient sharing of the same antenna by separating signals that are received and transmitted via one antenna in a communication system that is implemented using a frequency division duplex (FDD).

The basic structure of the duplexer includes a transmission filter and a reception filter, in addition to an antenna. The transmission filter is a band pass filter which passes a signal only within a frequency band to transmit the signal, and the reception filter is a band pass filter which passes a signal only within a frequency band to receive the signal. The duplexer permits transmission and reception via one antenna which adjusts the frequencies passed by the transmission filter and the reception filter.

The transmission filter and the reception filter, constructing the basic structure of the duplexer, can be implemented using a film bulk acoustic resonator (FBAR). The FBAR is small and lightweight and is known as a reliable means for configuring a filter for high power. An advantage of the FBAR is that it allows mass production with minimum cost, and can be compactly implemented.

In addition, the FBAR can realize a high quality factor (Q) value, which is an important characteristic of the filter, and can be used in a micro-frequency band. More advantageously, the FBAR can be implemented in personal communication system (PCS) and digital cordless system (DCS) bands.

The FBAR is manufactured so that a lower electrode, a piezoelectric layer, and an upper electrode are layered in order. When an external electrical field is applied, the FBAR generates resonance. In more detail, when electrical energy is applied to the upper and lower electrodes and the electrical field, which changes over time, is induced in the piezoelectric layer, resonance occurs, because the piezoelectric layer causes the piezoelectric effect which changes the electrical energy to mechanical energy of an acoustic wave form. In this case, because the FBAR passes only a signal within a specific band centering on the generated resonant frequency, it serves as the band pass filter.

Figure 10:
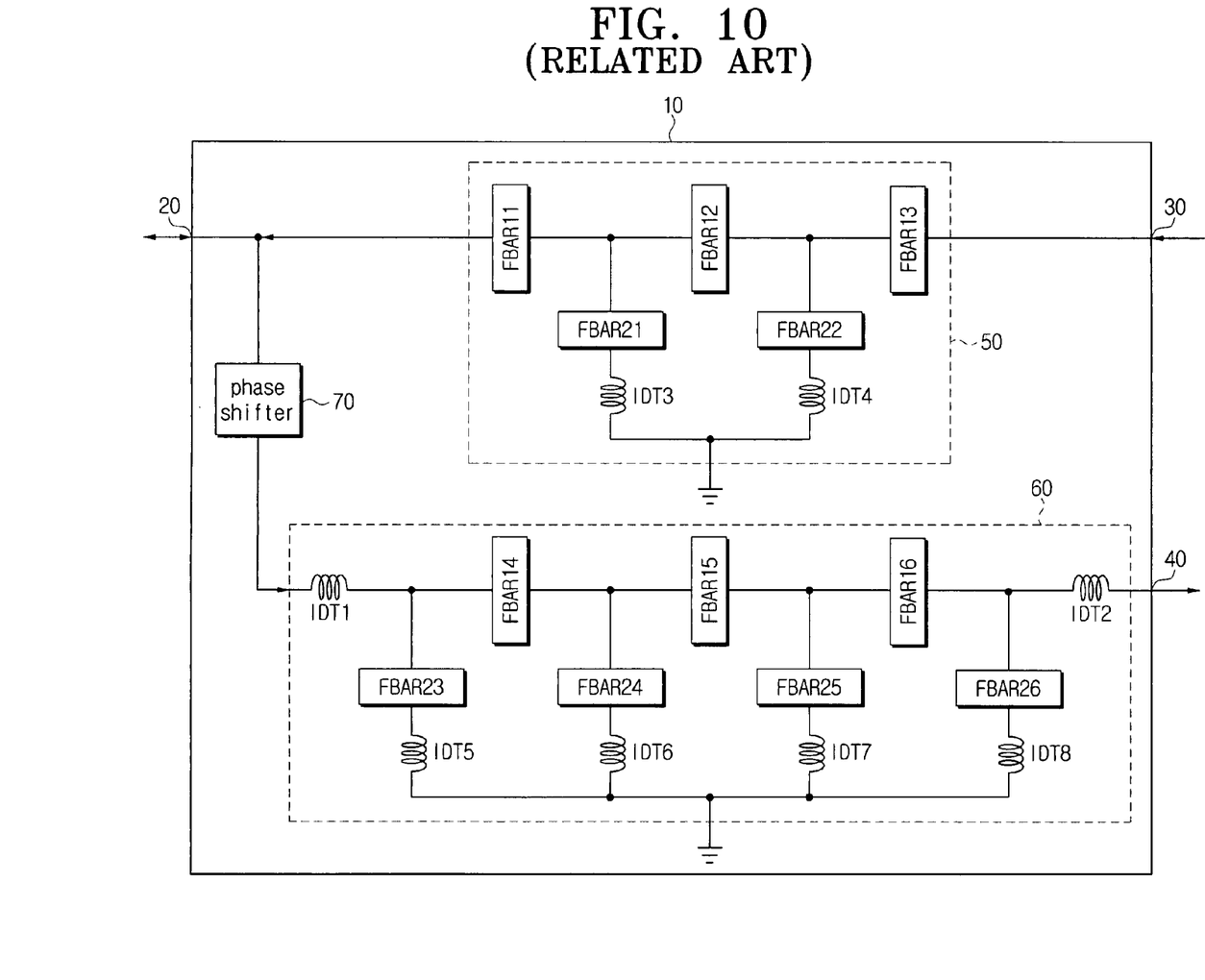
FIG. 10 is a circuit diagram of a ladder type filter implemented by incorporating a plurality of FBARs in series and in parallel, that is disclosed in U.S. Pat. No. 6,262,637.

FIG. 10 is a circuit diagram of a ladder type filter implemented by incorporating a plurality of FBARs in series and in parallel, as disclosed in U.S. Pat. No. 6,262,637.

Referring to FIG. 10, a conventional duplexer 10 comprises an antenna port 20, a transmission port 30, and a reception port 40. The duplexer 10 further comprises a transmission filter 50 between the antenna port 20 and the transmission port 30, a reception filter 60 between the antenna port 20 and the reception port 40, and a phase shifter 70 between the antenna port 20 and the reception filter 60.

The transmission filter 50 and the reception filter 60 comprise: a plurality of first resonators FBAR11 through FBAR16 that are connected between their coupled ports in series; a plurality of second resonators FBAR21 through FBAR26 that are formed on branching lines between the ports to which the transmission filter 50 and the reception filter 60 are connected, and connected to the first resonators FBAR11 though FBAR16 in parallel; and inductors IDT3 through IDT8, disposed between the second resonators FBAR21 through FBAR26 and a ground GND, and connected to the second resonators FBAR21 through FBAR 26 in series in order to regulate the frequency of the second resonators FBAR21 through FBAR26.

As described above, the plurality of first resonators FBAR11 through FBAR16 and the second resonators FBAR21 through FBAR26 are incorporated in series and in parallel to implement the ladder type filter. This functions as a band pass filter that filters signals in the specific frequency bands for transmission and reception.

Also, because the conventional duplexer 10 functions to properly separate the signals transmitted and received via one antenna, it is necessary to avoid interference between the transmitted signal and the received signal in order to improve the performance. To be more specific, because the frequency difference between the signals transmitted and received through the transmission filter and the reception filter is very small, the duplexer is sensitive to the signal interference. Therefore, it is necessary to prevent interference between the transmitted signal and the received signal.

In order to achieve this, the duplexer 10 generally requires an isolation part to prevent interference by isolating the transmission filter 50 and the reception filter 60. The performance of the duplexer 10 can be enhanced through the presence of the isolation part which prevents interference and noise insertion.

The isolation part typically implements the phase shifter 70 using a capacitor and an inductor to make the frequency phase difference of the transmitted and received signals 90 degrees. Thus, the isolation part can block the interference between the transmitted signal and the received signal.

As constructed above, the duplexer 10 needs to serially connect the inductors IDT3 through IDT8 to the second resonators FBAR21 through FBAR26 respectively to regulate the frequency of the transmission filter 50 and the reception filter 60, for example, to lower the resonant frequencies of the second resonators FBAR21 through FBAR26. In doing so, the inductors IDT3 through IDT8 employ high inductance of the 3~4 nH frequency and high Q.

In conclusion, when the conventional duplexer is manufactured, the number of inductors used increases, which is disadvantageous to high integration and miniaturization. The use of the inductors with the high Q raises the manufacturing costs.

SUMMARY OF THE INVENTION

The present invention is provided to address the above-mentioned and other problems and disadvantages which occur in the conventional arrangement. An aspect of the present invention is to provide a band pass filter which improves filtering, implements high integration, and reduces manufacturing costs by improving attenuation in a frequency band near a passing frequency band.

Another aspect of the present invention is to provide a duplexer with a band pass filter.

According to an aspect of the present invention, a band pass filter comprises a first resonant circuit, a second resonant circuit, and a third resonant circuit.

The first resonant circuit has n first resonators connected in series (n being a natural number greater than 1). The second resonator circuit faces the first resonant circuit and has m second resonators connected in series (m being a natural number greater than 1). The third resonant circuit has k third resonators connected in parallel on branching lines linking the first and second resonant circuits (k being a natural number greater than 1).

The first resonator, the second resonator, and the third resonator may be implemented using a film bulk acoustic resonator (FBAR).

The branching lines may be formed at both ends of the first resonator, and k may have the value n+1. The third resonator may be formed on the branching lines.

The branching lines may be formed only at a node between the first resonators when n is greater than 2. k may be n−1.

The first resonant circuit may be formed between a first signal port and a second signal port.

The first signal port may be an antenna port coupled to an antenna, and the second signal port may be a transmission port which sends a transmission signal to the antenna port. The first signal port may be an antenna port coupled to an antenna, and the second signal port may be a reception port which receives a reception signal transmitted to the antenna port.

Both ends of the second resonant circuit may be connected to a ground.

The second resonant circuit may further comprise an inductor between the ground and a front node, and an inductor between the ground and a rear node.

The first resonant circuit may further comprise an inductor connected to the first resonators of the front end and the rear end in parallel.

The ground may be connected to an arbitrary node between the second resonators in the second resonant circuit. In this situation, the ground may be connected to only one of the nodes between the second resonators in the second resonant circuit.

According to another aspect of the present invention, a duplexer comprises a first band pass filter, a second band pass filter, and a phase shifter. The first band pass filter is formed between a first signal port and a second signal port. The second band pass filter is formed between the first signal port and a third signal port. The phase shifter is formed between the first signal port and the second band pass filter.

Each of the first and second band filters comprises a first resonant circuit, a second resonant circuit, and a third resonant circuit. The first resonant circuit has n first resonators connected in series (n is a natural number greater than 1). The second resonator circuit faces the first resonant circuit and has m second resonators connected in series (m is a natural number greater than 1). The third resonant circuit has k third resonators connected in parallel on branching lines which links the first and second resonant circuits (k is a natural number greater than 1).

A front node and a rear node in the first resonant circuit of the first band pass filter may be connected to the first signal port and the second signal port, respectively, and a front node and a rear node in the first resonant circuit of the second band pass filter may be connected to the phase shifter and the third signal port, respectively.

Both ends of the second resonant circuit of each of the band pass filters may be connected to a ground.

The second resonant circuit of each of the band pass filters may further comprise an inductor between the ground and the front node, and an inductor between the ground and the rear node.

The first resonant circuit may further comprise an inductor which is connected to the front first resonator and the back first resonator in the first resonant circuit in parallel.

The ground may be connected to an arbitrary node between the second resonators in the second resonant circuit, or may be connected to only one of the nodes between the second resonators in the second resonant circuit.

The first signal port may be an antenna port coupled to an antenna, the second signal port may be a transmission port that provides a transmission signal to the antenna, and the third signal port may be a reception port which receives a reception signal applied to the antenna.

The band pass filter and the duplexer can improve filtering by having improved attenuation in the frequency band adjacent to the passing frequency band, and can have high integration and a reduction in manufacturing costs.

BRIEF DESCRIPTION OF THE DRAWINGS

The above aspects and features of the present invention will become more apparent by describing certain embodiments of the present invention with reference to the accompanying drawings, in which.

DETAILED DESCRIPTION OF THE EXEMPLARY EMBODIMENTS

Certain exemplary embodiments of the present invention will now be described in detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

Figure 1:
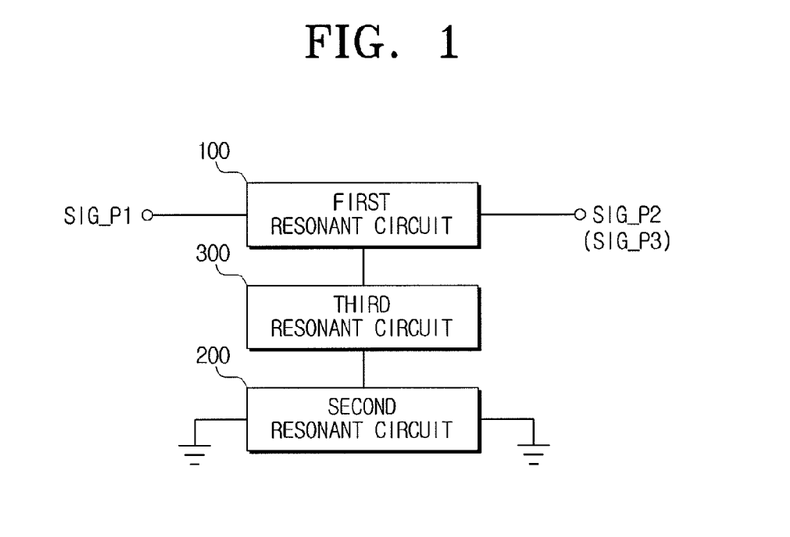
FIG. 1 is a block diagram of a band pass filter according to an exemplary embodiment of the present invention.

FIG. 1 is a block diagram of a band pass filter according to an exemplary embodiment of the present invention.

Referring to FIG. 1, the band pass filter according to an exemplary embodiment of the present invention comprises a first resonant circuit 100, a second resonant circuit 200, and a third resonant circuit 300.

The first resonant circuit 100 can be formed between a first signal port SIG_P1 and a second signal port SIG_P2, or between the first signal port SIG_P1 and a third signal port SIG_P3.

In an exemplary embodiment of the present invention, the band pass filter can be used as a transmission filter or a reception filter of a duplexer, which will be explained later. In other words, when the first signal port SIG_P1 is an antenna port, the second signal port SIG_P2 is a transmission port, and the third signal port SIG_P3 is a reception port, the first resonant circuit 100 can be formed between the first signal port SIG_P1 and the second signal port SIG_P2 and used as the transmission filter. Alternatively, the first resonant circuit 100 can be formed between the first signal port SIG_P1 and the third signal port SIG_P3 and used as the reception filter.

The second resonant circuit 200 is disposed facing the first resonant circuit 100 and connected to a ground GND at both ends.

The third resonant circuit 300 is formed on branching lines from the first and second resonant circuits 100 and 200. The third resonant circuit 300 is in parallel with the first and second resonant circuits 100 and 200 to electrically connect the first and second resonant circuits 100 and 200.

The first, second, third resonant circuits 100, 200, and 300 comprise one or more resonators, that is, one or more film bulk acoustic resonators (FBARs). The resonators in the first resonant circuit 100 and the resonators in the second resonant circuit 200 form a ladder structure. Likewise, the resonators in the second resonant circuit 200 and the resonators in the third resonant circuit 300 form a ladder structure. Accordingly, the resonators in the first, second, and third resonant circuits 100, 200 and 300 are constructed as a bridge.

The structure of the resonators is described in more detail below.

Figure 2:
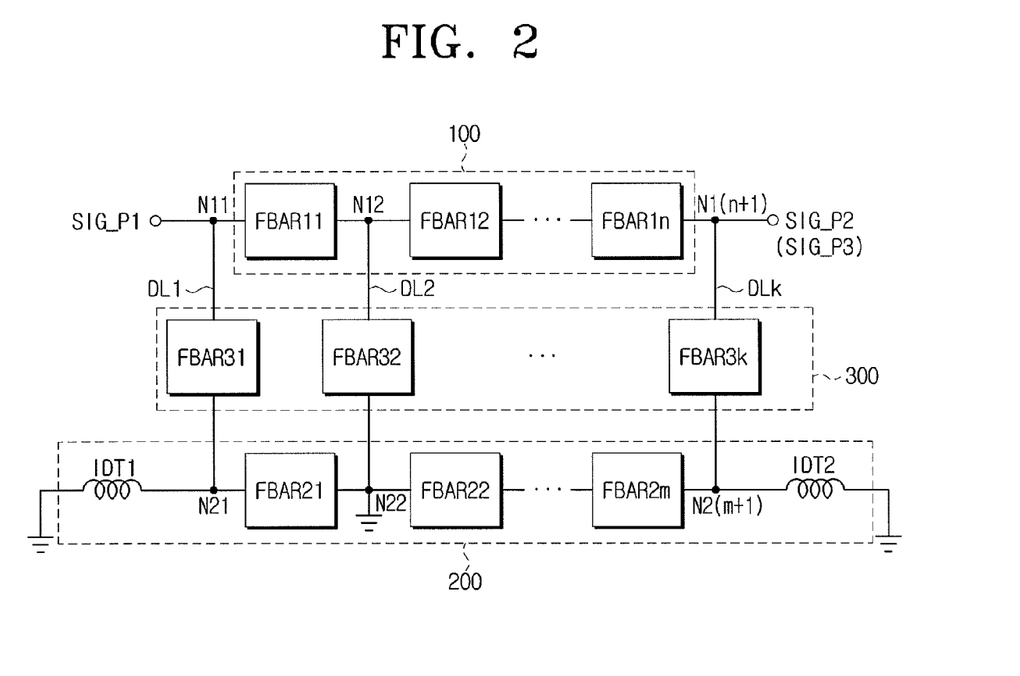
FIG. 2 is a simplified block diagram of a band pass filter according to one exemplary embodiment of the present invention.
Figures 3, 4:
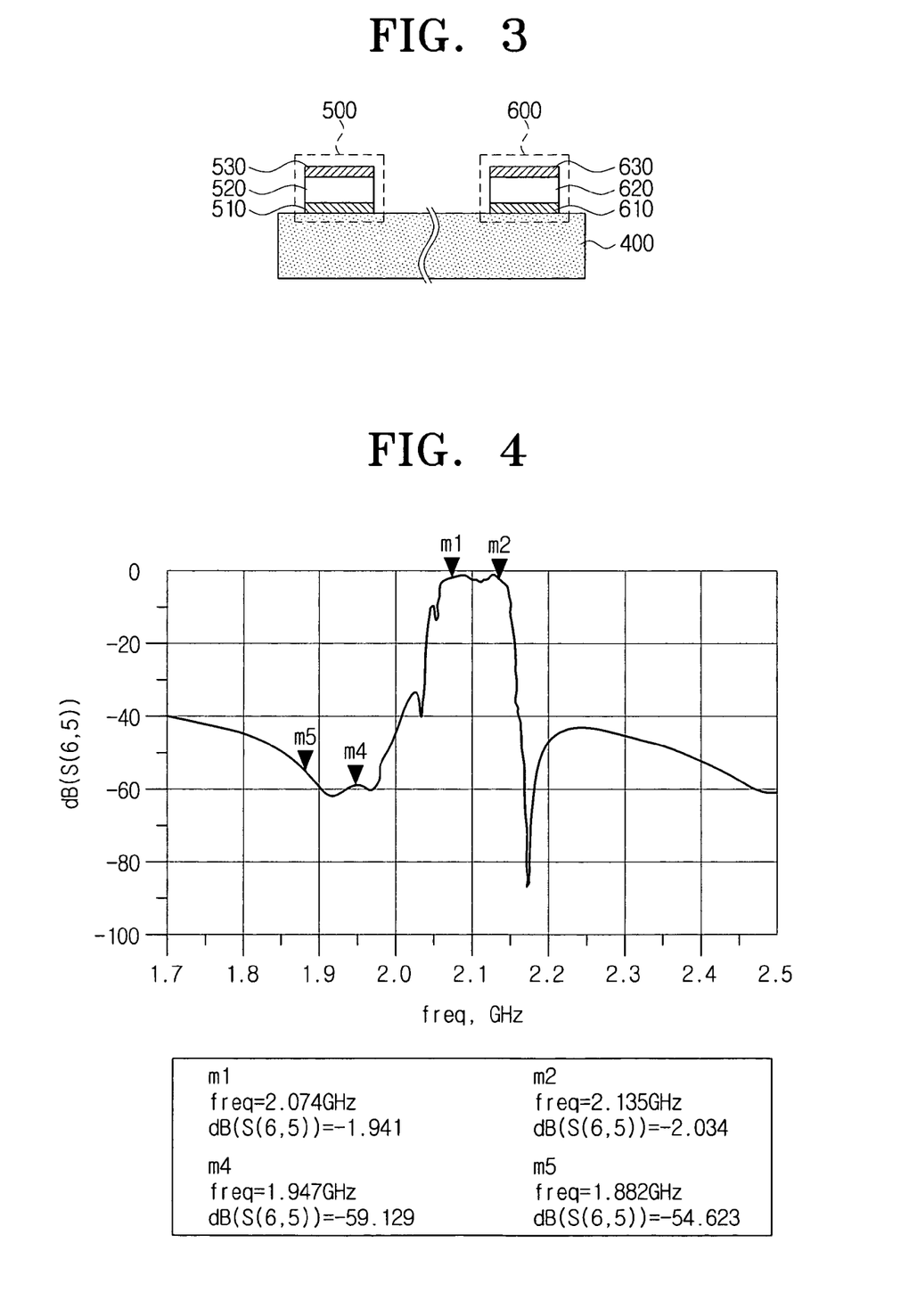
FIG. 3 is a cross-sectional diagram of a FBAR according to one exemplary embodiment of the present invention.
FIG. 4 is a diagram of a simulation result of filtering of the band pass filter of FIG. 1.

FIG. 2 is a simplified block diagram of a band pass filter according to one exemplary embodiment of the present invention, FIG. 3 is a cross-sectional diagram of a FBAR according to one exemplary embodiment of the present invention, and FIG. 4 is a diagram of simulation results of filtering of the band pass filter of FIG. 1.

Referring first to FIG. 3, resonators 500 and 600 adapted to the present invention comprise lower electrodes 510 and 610 on a substrate 400, piezoelectric layers 520 and 620, and upper electrodes 530 and 630. The resonator 500 indicates a resonator which constitutes a transmission filter and the resonator 600 indicates a resonator which constitutes a reception filter.

More specifically, the resonators 500 and 600 comprise the lower electrodes 510 and 610, which consist of a conductive material such as Al, W, Au, Pt or Mo, on the substrate 400, which consists of a semiconductor material such as Si or GaAs. The piezoelectric layers 520 and 620 consist of a material such as AlN or ZnO on the lower electrodes 510 and 610, and the upper electrodes 530 and 630 consist of a conductive material such as Al, W, Au, Pt or Mo.

The resonators 500 and 600 may further comprise a structure separating the substrate 400 from the resonators 500 and 600, such as a reflecting structure or an air gab structure, to prevent the bulk sound generated in the piezoelectric layers 520 and 620 from being affected by the substrate 400.

The resonators 500 and 600, as constructed above induce an electrical field temporally changing in the piezoelectric layers 520 and 620 by applying voltage to the lower electrodes 510 and 610 and the upper electrodes 530 and 630. Accordingly, the resonance occurs by generating a piezoelectric effect, that outputs certain acoustic waves. In doing so, the resonance frequencies of the resonators 500 and 600 are controlled separately by varying the surface area of the resonators 500 and 600 or the thickness of the upper electrodes 530 and 630.

Thus, the duplexer can serve as the transmission filter and the reception filter by controlling the resonant frequencies of the transmission resonator 500 and the reception resonator 600. The transmission filter and the reception filter are configured to connect to the plurality of transmission and reception resonators 500 and 600 respectively in series and in parallel to enhance the tuning of the resonant frequency and frequency filtering characteristics.

Referring back to FIG. 2, the band pass filter according to an embodiment of the present invention comprises the first resonant circuit 100, the second resonant circuit 200, and the third resonant circuit 300. The first resonant circuit 100 is formed between the first signal port SIG_P1 and the second or third signal port SIG_P2 or SIG_P3. The second resonant circuit 200 faces the first resonant circuit 100. The third resonant circuit 300, which is formed on branching lines DL1 through DLk that electrically interconnect the first resonant circuit 100 and the second resonant circuit 200, is coupled to the first and second resonant circuits 100 and 200 in parallel to electrically connect the first and second resonant circuits 100 and 200.

Specifically, the first resonant circuit 100 has a plurality of resonators FBAR11 through FBAR1$n$ in series between the first signal port SIG_P1 and the second or third signal port SIG_P2 or SIG_P3.

The second resonant circuit 200 has a plurality of resonators (FBAR21 through FBAR2$m$) connected in series. Both ends of the second resonant circuit 200 are connected to the ground GND. A first inductor IDT1 and a second inductor IDT2 are provided on a first node N21 between the ground GND and the FBAR21, and on a node N2(m+1) between the GND and the FBAR2$m$, respectively. The first and second inductors IDT1 and IDT2 are equipped to prevent the change of the resonant frequency which is intended in the design of the duplexer when the transmission and reception frequencies are applied to the duplexer in different frequency bands, explained below.

It is advantageous to connect one of the nodes N22 through N2$m$ between the resonators FBAR21 through FBAR2$m$ adjacent to the second resonant circuit 200, for example, to connect the node N22 to the ground GND, in order to stabilize the receiving or transmitting frequency.

The third resonant circuit 300 has a plurality of resonators FBAR31 through FBAR3k connected in parallel on the branching lines DL1 through DLk connecting the first resonant circuit 100 and the second resonant circuit 200.

For instance, resonator FBAR31 is formed on the branching line DL1. The branching line DL1 branches off from the node N11 between the first signal port SIG_P1 and the resonator FBAR11 and coupled to the node N21 between the ground GND and the resonator FBAR21.

Therefore, the resonators of the first, second, third resonant circuits 100, 200, and 300 are configured as a bridge structure. For instance, the resonator FBAR11 of the first resonant circuit 100, the resonator FBAR21 of the second resonant circuit 200, and the resonators FBAR31 and FBAR32 of the third resonant circuit 300 form a bridge structure. The presence of the bridge structure can remove the inductors IDT3 through IDT8 for regulating the frequency, as shown in FIG. 10.

Although in the example given in FIG. 2 illustrates the number of the n resonators FBAR11 through FBAR1n in the first resonant circuit 100 is equal to the number of the m resonators FBAR21 through FBAR2m in the second resonant circuit 200, different numbers of resonators can be provided.

Although the example given in FIG. 2 illustrates the resonator FBAR31 as formed on the first branching line DL1 connecting the node N11 with the node N21 in the bridge structure and k is the value n+1, k may be the value n−1 the branching lines DL1 and DLk are omitted from the node N11 and the node N1(n+1).

In addition, it is possible to configure the resonators of the first, second, third resonant circuits 100, 200, and 300 in the bridge structure by varying the number of the branching lines DL.

In FIG. 2, the first resonators FBAR11 through FBAR1n may have a different resonant frequency from the second resonators FBAR21 through FBAR2m, and the first resonators FBAR11 through FBAR1n and the second resonators FBAR21 through FBAR2m may have different resonant frequencies, respectively. In short, the resonators can be arbitrarily configured to generate the resonant frequency of the frequency band to be filtered.

With the band pass filter constructed above, the filtering for passing a specific frequency band shows the abrupt attenuation outside a frequency band to be filtered by the band pass filter, for example, outside the frequency band of 2.07~2.16 GHz and the great transmission coefficient S(6, 5) in the frequency band of 2.07~2.16 GHz, as shown in FIG. 4.

By contrast, as the transmission coefficient S(6, 5) is below −40 dB in the adjacent frequency band, for example, in the frequency band of 1.88~1.95 GHz, the filter characteristic lowers the transmittance in the frequency band adjacent to the passing frequency band. Hence, this structure is suitable for applications wherein the mobile communication device has a small difference between the transmission and reception frequency bands.

When the resonators are structured as a bridge, the attenuation is improved. Thus, it is possible to remove the inductors IDT3 through IDT8 (FIG. 10) which have been provided to improve the filtering characteristic by controlling the resonant frequencies, and to use the inductors IDT1 and IDT2 which have a low inductance of about 1 nH and low Q.

Additionally, because the inductors IDT3 through IDT8 are omitted, the process margin can be improved and the size of the FBAR can be enlarged. This permits a far greater improvement of the filter performance by enhancing the resonant frequency characteristic.

Figure 5:
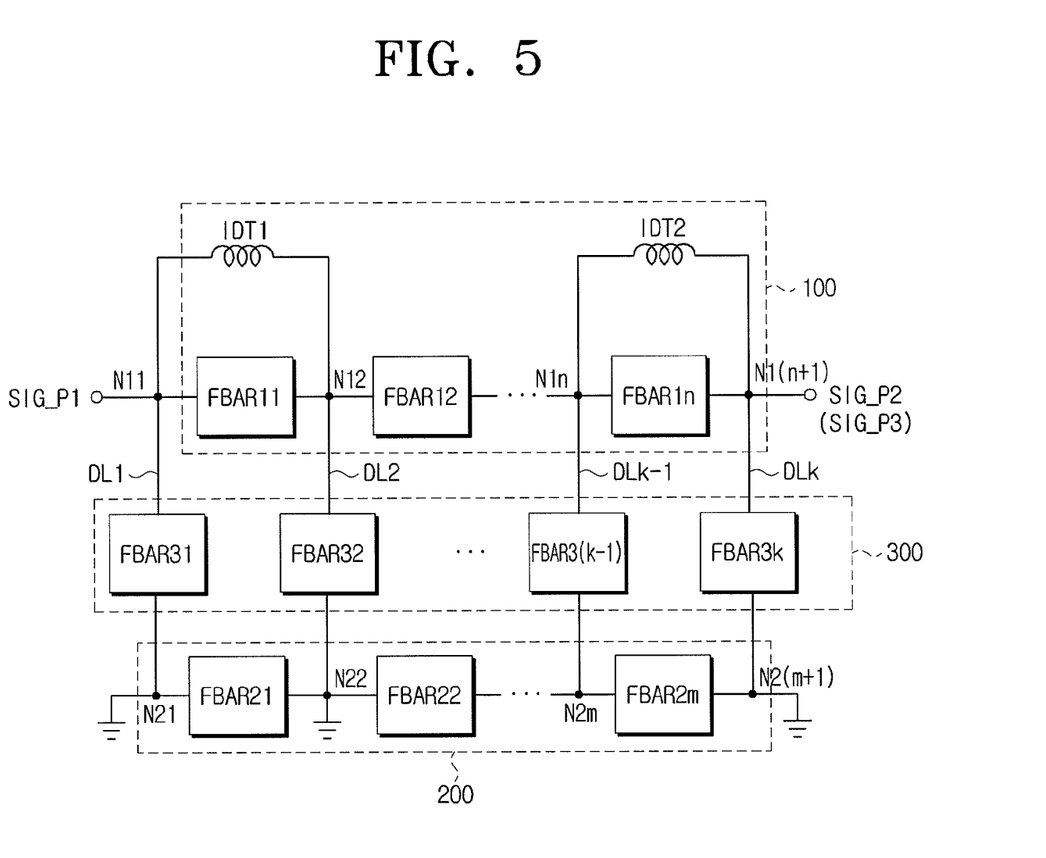
FIG. 5 is a simplified block diagram of a band pass filter according to another exemplary embodiment of the present invention.
Figure 6:
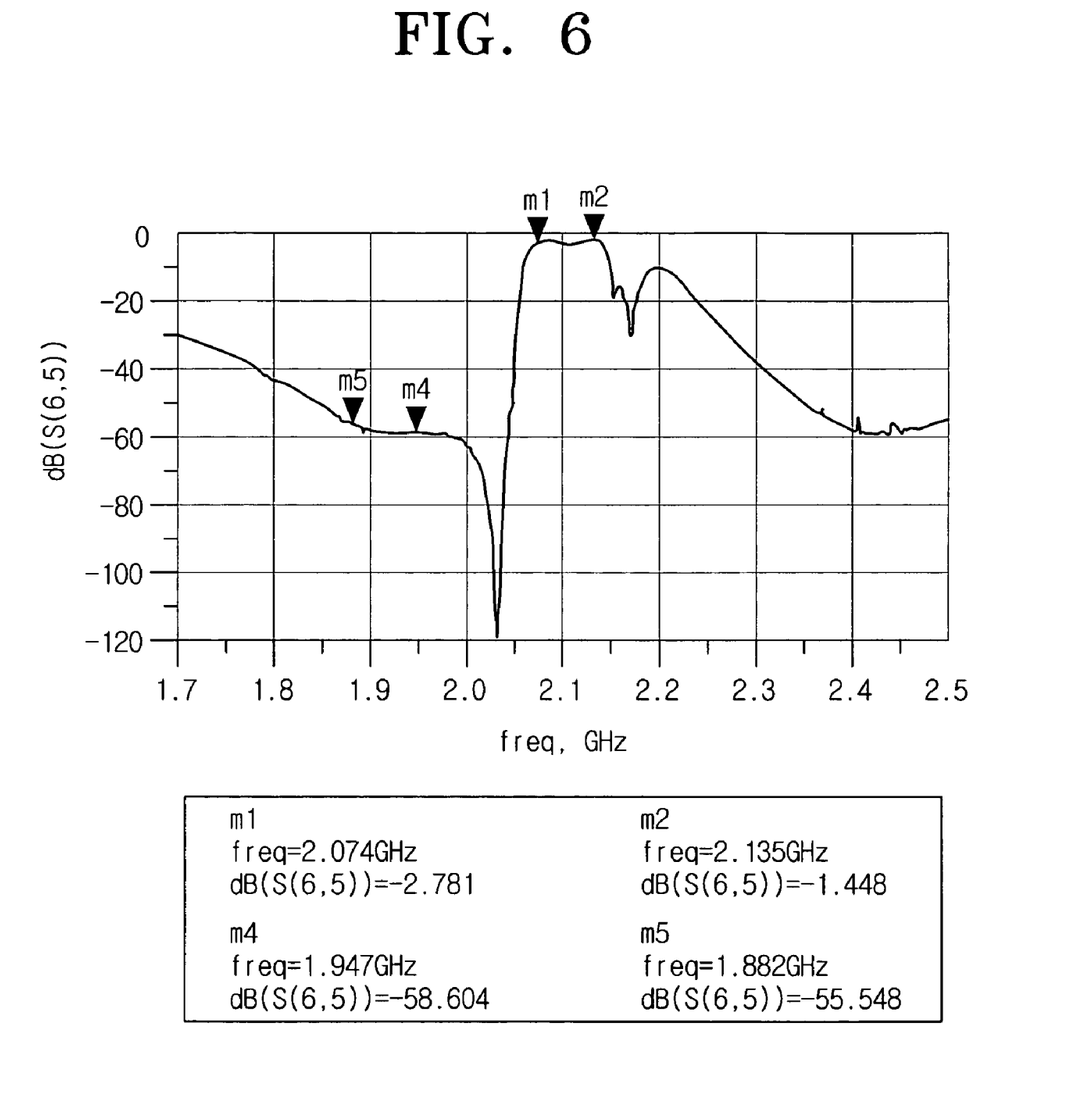
FIG. 6 is a diagram of a simulation result of filtering of the band pass filter of FIG. 5.

FIG. 5 is a simplified block diagram of a band pass filter according to another exemplary embodiment of the present invention, and FIG. 6 is a diagram showing a simulation result of the filtering of the band pass filter of FIG. 5.

The band pass filter according to another exemplary embodiment of the present invention, as shown in FIG. 5, comprises a first resonant circuit 100 between a first signal port SIG_P1 and a second or third signal port SIG_P2 or SIG_P3, a second resonant circuit 200 facing the first resonant circuit 100, and a third resonant circuit 300 on branching lines DL1 through DLk that electrically connect the first and second resonant circuits 100 and 200.

The first resonant circuit 100 comprises a plurality of resonators FBAR11 through FBAR1n. The resonators FBAR11 through FBAR1n are connected to each other in series between the first signal port SIG_P1 and the second or third signal port SIG_P2 or SIG_P3. Inductors IDT1 and IDT2 are connected to the resonators at the front and back of the first resonant circuit 100, that is, to the resonator FBAR11 and the resonator FBAR1n in parallel, respectively. Note that the first and second inductors IDT1 and IDT2 are provided to prevent the change of the intended resonant frequency when signals in different frequency bands are applied to the duplexer, explained below.

The second resonant circuit 200 comprises a plurality of resonators FBAR21 through FBAR2m. The resonators FBAR21 through FBAR2m are connected to each other in series. Both ends of the second resonant circuit 200 are connected to a ground GND. It is advantageous if one of the nodes FBAR22 through FBAR2m formed between the resonators adjacent to the second resonant circuit 200 is connected to the ground GND to stabilize the received and transmitted frequencies.

The third resonant circuit 300 comprises a plurality of resonators FBAR31 through FBAR3m including of at least one FBAR. The resonators FBAR31 through FBAR3m are formed in parallel on branching lines DL1 through DLk which link the first resonant circuit 100 to the second resonant circuit 200. For instance, the resonant FBAR31 is formed on the first branching line DL1 which branches off from the node N11 between the first signal line SIG_P1 and the resonator FBAR11 and connected to the node N21 between the ground GND and the resonator FBAR21.

Hence, the resonators FBARs in the first, second, and third resonant circuits 100, 200, and 300, are configured to form a bridge structure. For instance, the resonator FBAR11 of the first resonant circuit 100, the resonator FBAR21 of the second resonant circuit 200, and the and $32^{nd}$ resonators FBAR31 and FBAR32 of the third resonant circuit 300 form a bridge structure. By the presence of the bridge structure, the inductors IDT3 through IDT8 as shown in FIG. 10 can be removed.

With the band pass filter constructed above, the filtering for passing a specific frequency band shows the abrupt attenuation outside a frequency band to be filtered by the band pass filter, for example, outside the frequency band of 2.07~2.16 GHz and the great transmission coefficient S(6, 5) in the frequency band of 2.07~2.16 GHz, as shown in FIG. 6.

In the adjacent frequency band, for example, in the frequency band of 1.88~1.95 GHz, the filtering shows the transmission coefficient S(6, 5) below −40 dB and the low transmission in the frequency band adjacent to the passing frequency band. As the transmission coefficient S(6, 5) hardly changes in the frequency band of 1.88~1.95 GHz, the filtering characteristic is more stable than the band pass filter of FIG.

2. When the mobile communication device has a small difference between the transmitted and received frequency bands, this band pass filter is suitable.

When the resonators are structured as a bridge, the attenuation is improved. Thus, it is possible to remove the inductors IDT3 through IDT8 (FIG. 10) which have been provided to improve the filtering characteristic by controlling the resonant frequencies, and to use the inductors IDT1 and IDT2 which have a low inductance of about 1 nH and low Q.

In addition, as the inductors IDT3 through IDT8 are removed, the process margin can be enhanced and the size of the FBAR can be enlarged more. This implies the enhanced filter performance through the improvement of the resonant frequency characteristic.

Figure 7:
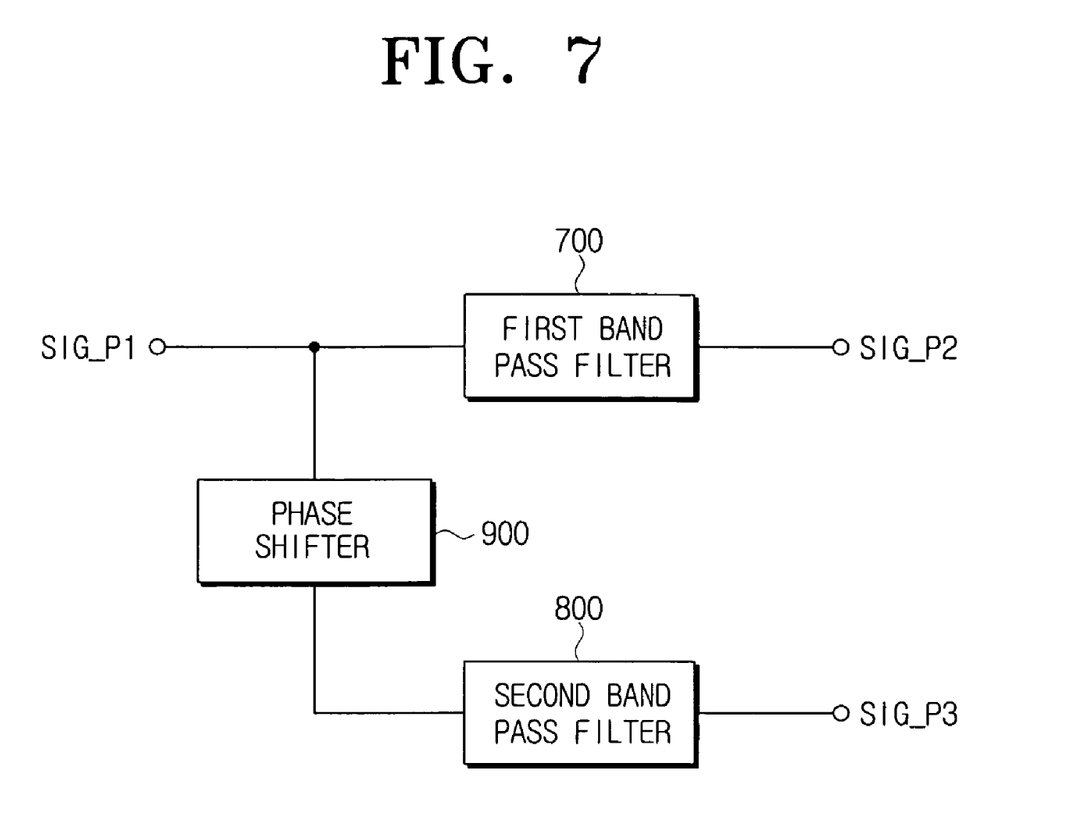
FIG. 7 is a simplified block diagram of a duplexer according to an exemplary embodiment of the present invention.
Figure 8:
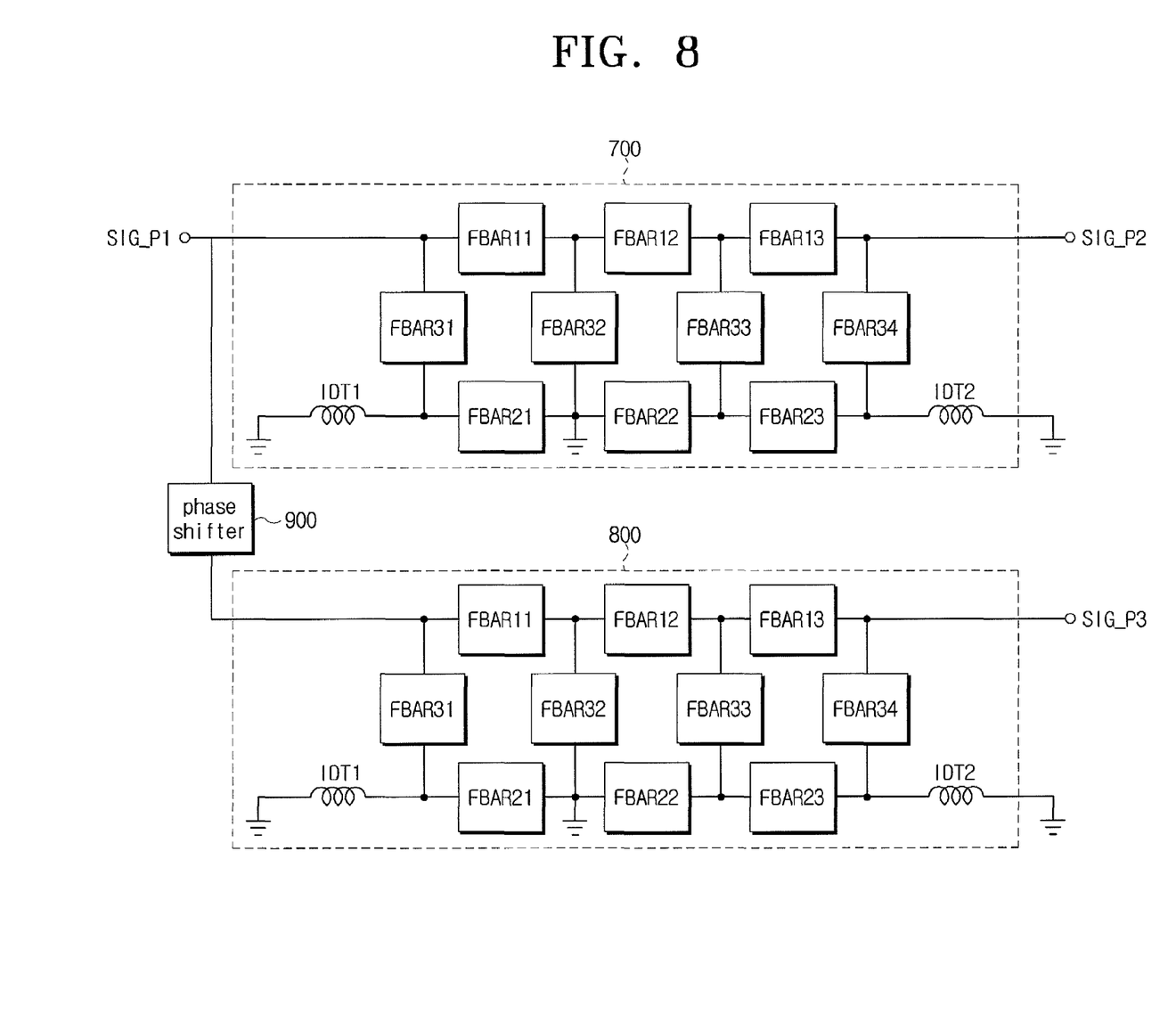
FIG. 8 is a detailed block diagram of the duplexer of FIG. 7.

FIG. 7 is a simplified block diagram of a duplexer according to an exemplary embodiment of the present invention, and FIG. 8 is a detailed block diagram of the duplexer of FIG. 7.

The duplexer illustrated in FIG. 7 comprises a first band pass filter 700, a second band pass filter 800, and a phase shifter 900.

The first band pass filter 700 is formed between a first signal port SIG_P1 and a second signal port SIG_P2. The second band pass filter 800 is formed between the first signal port SIG_P1 and a third signal port SIG_P3. The phase shifter 900 is formed between the first signal port SIG_P1 and the second band pass filter 800.

In an exemplary embodiment of the present invention, the duplexer implements the first band pass filter 700 and the second band pass filter 800 using, for example, the band pass filter of FIG. 2, as shown in FIG. 8.

Note that the first and second band pass filters 700 and 800 may be implemented by using the band pass filter of FIG. 5 or combining the band pass filter of FIG. 2 and the band pass filter of FIG. 5.

Although n and m are 3 and k is 4 in FIG. 8, for example, the designer may vary the values of n, m and k.

Further descriptions thereof will be omitted for the sake of brevity.

The phase shifter 900 is provided to isolate the first band pass filter 700 and the second band pass filter 800 from each other to prevent interference arising due to the transmission frequency and the reception frequency, transmitted and received via the first signal port SIG_P1, that is, via one antenna port. To avoid interference, when the difference between the transmission frequency and the reception frequency is very small, a 90° phase shifter that makes the phase difference between the transmission frequency and the reception frequency of 90 degrees, may be formed which incorporates inductors and capacitors.

By configuring the second signal port SIG_P2 as a transmission port and the third signal port SIG_P3 as a reception port, the first band pass filter 700 can serve as the transmission filter and the second band pass filter 800 can serve as the reception filter.

Figure 9:
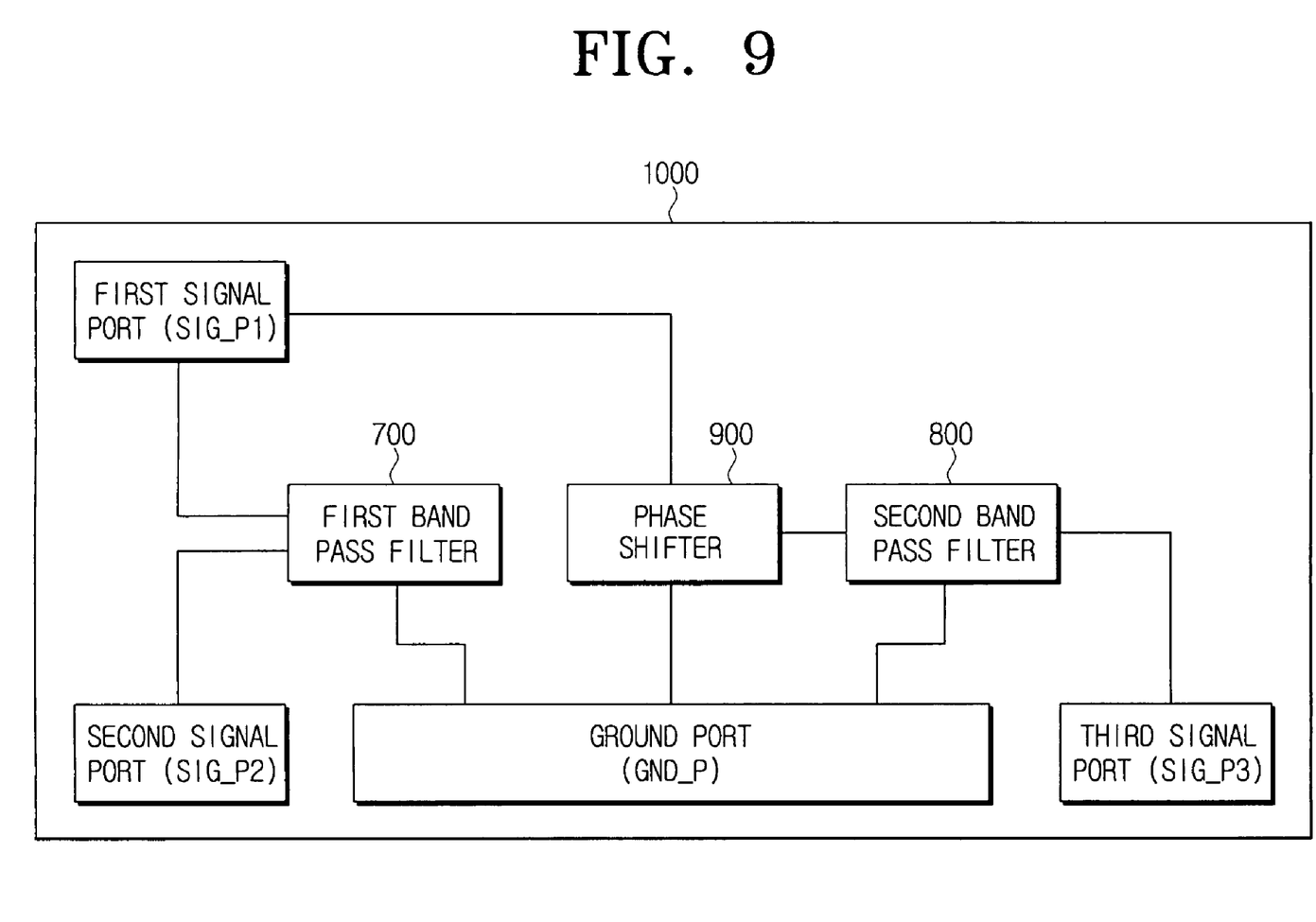
FIG. 9 is a block diagram of a duplexer constructed as a single chipset according to an exemplary embodiment of the present invention.

FIG. 9 is a block diagram of a duplexer constructed as a single chip set according to an exemplary embodiment of the present invention.

Referring to FIG. 9, the duplexer 1000 according to an exemplary embodiment of the present invention comprises a first band pass filter 700, a second band pass filter 800, a phase shifter 900, a first signal port SIG_P1, a second signal port SIG_P2, a third signal port SIG_P3, and a ground port GND_P.

The first and second band pass filters 700 and 800 can employ a filter which is implemented by incorporating FBARs in series and in parallel as shown in FIG. 2 or FIG. 5.

The first, second, and third signal ports SIG_P1, SIG_P2, and SIG_P3, which are capable of electrically connecting to an external element, are formed with a conductive material. The first, second, and third signal ports SIG_P1, SIG_P2, and SIG_P3 are connected to the first band pass filter 700, the second band pass filter 800, and the phase shifter 900 through connection lines formed with a metal.

The ground port GND_P is electrically connected with an external ground terminal. The ground port GND_P is linked to the first band pass filter 700, the second band pass filter 800, and the phase shifter 900 through connection lines formed with a metal.

The first signal port SIG_P1 interconnects an external antenna (not shown) to the first band pass filter 700 and the phase shifter 900, respectively. When the first band pass filter 700 serves as the transmission filter and the second band pass filter 800 serves as the reception filter, the transmission frequency is applied to the antenna via the first signal port SIG_P1 rather than to the second band pass filter 800 because of the presence of the phase shifter 900.

As illustrated in FIG. 7, the phase shifter 900 can be implemented using a 90° phase shifter that incorporates inductors and capacitors. The phase shifter 900 isolates the first and second band pass filters 700 and 800 from each other.

When the duplexer 1000 is fabricated as a single chip set, the process margin of the resonators in the first and second band pass filters 700 and 800 is improved by removing the inductors IDT3 through IDT8 from the duplexer of FIG. 10. This can raise the resonant frequency characteristic by expanding the surface area of the resonators.

Because the resonant frequency characteristic of the resonators is enhanced, the inductors IDT1 and IDT2 with the lower inductance than those in the duplexer of FIG. 10. Even with the inductors IDT1 and IDT2 of the lower Q, however, the band pass filter and the duplexer can provide the similar or more efficient filtering characteristic.

As set forth above, the band pass filter and the duplexer can improve the signal attenuation in the frequency band adjacent to the passing frequency band by configuring the resonators as a bridge structure.

Therefore, even when the inductors are used in sufficient numbers to regulate the resonant frequencies of the resonators with the low Q, the filtering characteristic above the conventional standard can be acquired and the manufacture cost can be reduced.

When the duplexer is implemented as a single chip of the same size by reducing the number of inductors used, the process margin of the resonators can be enhanced. Thus, the resonant frequency characteristics of the resonators can be improved and manufacturing can be made easier.

Therefore, the performance of the duplexer can be improved, because the filtering characteristics of the reception filter and the transmission filter are improved and the interference is prevented.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A band pass filter comprising:
a first resonant circuit in which n first resonators are connected in series, where n is a natural number greater than 2;

a second resonant circuit that faces the first resonant circuit and has m second resonators connected in series, where m is a natural number greater than 2; and a third resonant circuit in which k third resonators are connected in parallel on branching lines linking the first and second resonant circuits, where k is a natural number greater than 2, wherein both ends of the second resonant circuit are directly connected to a ground.

2. The band pass filter as in claim 1, wherein the first resonator, the second resonator, and the third resonator are implemented using a film bulk acoustic resonator (FBAR).

3. The band pass filter as in claim 1, wherein the branching lines are formed at both ends of the first resonator, and k is n+1.

4. The band pass filter as in claim 3, wherein the third resonator is formed on the branching lines, respectively.

5. The band pass filter as in claim 1, wherein the branching lines are formed only at a node between the first resonators when n is greater than 2, and k is n−1.

6. The band pass filter as in claim 1, wherein the first resonant circuit is formed between a first signal port and a second signal port.

7. The band pass filter as in claim 6, wherein the first signal port is an antenna port coupled to an antenna, and the second signal port is a transmission port that sends a transmission signal to the antenna port.

8. The band pass filter as in claim 6, wherein the first signal port is an antenna port coupled to an antenna, and the second signal port is a reception port that receives a reception signal applied to the antenna port.

9. The band pass filter as in claim 6, wherein the first resonant circuit comprises an inductor connected to the first resonators of a front end and a back end in parallel.

10. The band pass filter as in claim 6, wherein the ground is connected to an arbitrary node between the second resonators in the second resonant circuit.

11. The band pass filter as in claim 10, wherein the ground is connected only to one of the nodes between the second resonators in the second resonant circuit.

12. A duplexer comprising:

a first band pass filter formed between a first signal port and a second signal port;

a second band pass filter formed between the first signal port and a third signal port; and a phase shifter formed between the first signal port and the second band pass filter, wherein each of the first and second band pass filters comprises a first resonant circuit in which n first resonators are connected in series, where n is a natural number greater than 2, a second resonant circuit that faces the first resonant circuit and has m second resonators connected in series, where m is a natural number greater than 2, and a third resonant circuit in which k third resonators are connected in parallel on branching lines linking the first and second resonant circuits, where k is a natural number greater than 2, wherein both ends of the second resonant circuit are directly connected to a ground.

13. The duplexer as in claim 12, wherein a front node and a rear node in the first resonant circuit of the first band pass filter are connected to the first signal port and the second signal port, respectively, and a front node and a rear node in the first resonant circuit of the second band pass filter are connected to the phase shifter and the third signal port, respectively.

14. The duplexer as in claim 13, wherein the first resonant circuit further comprises an inductor that is connected in parallel to the front and rear first resonators in the first resonant circuit.

15. The duplexer as in claim 13, wherein the ground is connected to an arbitrary node between the second resonators in the second resonant circuit.

16. The duplexer as in claim 15, wherein the ground is connected to only one of the nodes between the second resonators in the second resonant circuit.

17. The duplexer as in claim 12, wherein the first signal port is an antenna port coupled to an antenna, the second signal port is a transmission port which provides a transmission signal to the antenna, and the third signal port is a reception port which receives a reception signal applied to the antenna.

* * * * *